US009467120B1

(12) United States Patent (10) Patent No.: US 9,467,120 B1
Song (45) Date of Patent: Oct. 11, 2016

(54) POWER MANAGEMENT FOR PCI EXPRESS

(71) Applicant: Altera Corporation, San Jose, CA (US)

(72) Inventor: Ting Lok Song, Penang (MY)

(73) Assignee: Altera Corporation, San Jose, CA (US)

( * ) Notice: Subject to any disclaimer, the term of this patent is extended or adjusted under 35 U.S.C. 154(b) by 238 days.

(21) Appl. No.: 14/135,447

(22) Filed: Dec. 19, 2013

(51) Int. Cl.
*G06F 1/26* (2006.01)
*G06F 1/32* (2006.01)
*H03K 3/012* (2006.01)

(52) U.S. Cl.
CPC ............ *H03K 3/012* (2013.01); *G06F 1/3237* (2013.01); *G06F 1/3253* (2013.01)

(58) Field of Classification Search
CPC .... H03K 3/012; G06F 1/3237; G06F 1/3253
USPC .................................. 713/300, 320
See application file for complete search history.

(56) References Cited

U.S. PATENT DOCUMENTS

| | | | | |
|---|---|---|---|---|
| 5,596,756 A * | 1/1997 | O'Brien | ............... | G06F 1/3215 710/310 |
| 5,828,579 A * | 10/1998 | Beausang | ...... | G01R 31/318586 714/726 |
| 7,257,655 B1 * | 8/2007 | Burney | ................. | G06F 13/423 370/408 |
| 7,313,712 B2 * | 12/2007 | Cherukuri | ............. | G06F 1/3209 713/300 |
| 7,320,080 B2 * | 1/2008 | Solomon | ................. | H04L 29/06 370/395.1 |
| 7,370,132 B1 * | 5/2008 | Huang | ................ | G06F 13/4018 710/305 |
| 7,743,268 B2 * | 6/2010 | Hinosugi | ............... | H04B 10/40 370/463 |
| 7,861,113 B2 * | 12/2010 | Wang | ...................... | G06F 1/206 713/320 |
| 7,965,741 B2 * | 6/2011 | Frodsham | ......... | H04W 52/0287 370/328 |
| 7,978,802 B1 * | 7/2011 | Raha | ........................ | H03L 7/07 375/371 |
| 8,031,731 B2 * | 10/2011 | Yu | ............................ | H04L 49/30 370/419 |
| 8,086,982 B2 * | 12/2011 | Chang | ....................... | G06F 1/10 716/108 |
| 8,234,510 B2 * | 7/2012 | Diab | ..................... | G06F 1/3209 713/300 |
| 8,407,504 B2 * | 3/2013 | Walsh | ................... | G06F 1/3203 713/322 |
| 8,769,332 B2 * | 7/2014 | Ziesler | .................. | G06F 1/3237 326/93 |
| 8,782,456 B2 * | 7/2014 | Tan | ....................... | G06F 1/3203 713/320 |
| 8,788,862 B1 * | 7/2014 | Vijayaraghavan | .... | G06F 1/3278 713/300 |
| 2005/0102437 A1 * | 5/2005 | Pettey | ................. | G06F 13/4022 710/1 |
| 2005/0154930 A1 * | 7/2005 | Morrow | .................... | G06F 1/26 713/300 |
| 2009/0279889 A1 * | 11/2009 | Kirkpatrick | ...... | H04B 10/25752 398/41 |
| 2011/0060931 A1 * | 3/2011 | Radhakrishnan | ..... | G06F 1/3203 713/340 |

OTHER PUBLICATIONS

PCI Express Base Specification Revision 3.0, pp. 1-860, Peripheral Component Interconnect Special Interest Group PCI-SIG, Nov. 10, 2010.
PHY Interface for the PCI Express, SATA and USB 3.0 Architectures, Version 4.0, pp. 1-81, Intel Corporation, Sep. 1, 2011.

* cited by examiner

*Primary Examiner* — Mark Connolly
(74) *Attorney, Agent, or Firm* — Fletcher Yoder PC

(57) ABSTRACT

Systems and methods are provided for managing power of a device coupled with a transceiver module, in communication with a high-speed interface. In one aspect, a dynamic clock trunk tree associated with the transceiver module is controlled by a trunk driver having a first clock tree gate. A dynamic clock leaf tree associated with the device is controlled by a leaf driver having a second clock tree gate. Significant power savings may be achieved, for example, by triggering activation of clock gating mechanisms.

20 Claims, 6 Drawing Sheets

400

| Powerdown[1:0] | 00 | 01 | 10 | 11 | Reset | |
|---|---|---|---|---|---|---|
| Power State | P0 | P0s | P1 | P2 | Reset | |
| PCS State | | | | | | |
| Transmit Data | Valid | N/A | N/A | N/A | N/A | ~403 |
| Tx Phase Compensation FIFO Pointers | Active | Reset | Reset | Reset | Reset | ~404 |
| 8b/10b Encoder | Active | Reset | Reset | Reset | Reset | ~405 |
| PCLK Output | ON | ON | ON | OFF | OFF | ~406 |
| Rx Phase Compensation FIFO Pointers | Active | Reset | Reset | Reset | Reset | ~407 |
| 8b/10b Decoder | Active | Active | Reset | Reset | Reset | ~408 |
| Rate-Match Buffer | Active | Active | Reset | Reset | Reset | ~409 |
| Word Aligner | Active | Active | Reset | Reset | Reset | ~410 |
| RX Parallel Clock | Active | Active | ON | OFF | OFF | ~411 |

| Powerdown[1:0] | 00 | 01 | 10 | 11 | Reset |
|---|---|---|---|---|---|
| Power State | P0 | P0s | P1 | P2 | Reset |
| PMA Tx State | | | | | |
| Tx Bias | On | On | On | Off | Off |
| Tx Pad | Active | Common Mode | Common Mode | High-Z | Vss/Vcc |
| Serializer | On | Off | Off | Off | Off |
| | | | | | |
| PMA Rx State | | | | | |
| CDR | On | On | Off | Off | Off |
| Rx Equalizers | On | On | Off | Off | Off |
| Deserializer | On | Active | Off | Off | Off |
| Signal Detect | On | On | On | Periodic On/Off | Off |

POWER MANAGEMENT FOR PCI EXPRESS

FIELD OF USE

This disclosure relates generally to the area of system interconnect technology.

BACKGROUND OF THE INVENTION

The demand for new high performance speeds and features in high-speed serial data communication is ever increasing. One common high-speed serial interface (HSSI) protocol used to achieve such speeds is PCI Express (PCIe), which is a low-cost, scalable, switched, point-to-point, serial I/O interconnection scheme. PCIe provides a number of benefits over existing standards, including increased bandwidth availability and support for real-time data transfer services.

The PCIe standard defines link power management states such as L0s, L1, and L2/L3 that a PCIe physical Link is permitted to enter in response to either software drive "D-state" or active state power management activities. These link power management states allow PCIe devices to save power when the PCIe link is idle. Description of these states can be found in the "PCI Express Base Specification," Revision 3.0, dated Nov. 10, 2010, which is hereby incorporated by reference in its entirety.

Although the PCIe link power management is well-defined, few systems with PCIe interconnect fully utilize the benefits of the PCIe low power states. One example of such devices that typically do not fully utilize the benefits of PCIe link power management is FPGA devices.

The efficiency of the power management of a system architecture depends on how much of the device circuitry is gated during the PCIe low power states. This dependency of gating efficiency on the amount of gated circuitry is exemplified in devices with hard-coded intellectual property (IP) blocks that support PCIe functionality. Where the hard IP does not fully utilize the PCIe low power states to achieve idle power savings, the power consumption may significantly increase. This increase in power consumption may occur not only in the hard IP but also in circuitry associated with communication layers, such as physical coding sublayer (PCS) and physical medium attachment (PMA).

As demand for higher data rates and more functionality continues to grow, so too does the demand for power, in order to fulfill ever-increasing performance and throughput requirements. As such, power optimization, power consumption reduction, and intelligent power management are becoming increasingly more important.

SUMMARY

Systems and methods are provided for managing power of a device coupled with a transceiver module. The transceiver module may be in communication with a high-speed interface.

In one aspect of the present disclosure, an integrated circuit includes a dynamic clock trunk tree associated with a transceiver module. The dynamic clock trunk tree is controlled by a trunk driver that has a first clock tree gate. The integrated circuit also includes a dynamic clock leaf tree associated with a PCI Express (PCIe) device coupled with the transceiver module. The dynamic clock leaf tree is controlled by a leaf driver that has a second clock tree gate, a gate enable block, and a gate disable block.

In another aspect of the present disclosure, a communication interface includes circuitry configurable as a dynamic clock trunk tree associated with a transceiver module. The dynamic clock trunk tree is controlled by a trunk driver having a first clock tree gate. The communication interface also includes circuitry configurable as a dynamic clock leaf tree associated with a PCI Express (PCIe) device coupled with the transceiver module. The dynamic clock leaf tree is controlled by a leaf driver having a second clock tree gate, a gate enable block, and a gate disable block.

In yet another aspect of the present disclosure, a method for configuring an integrated circuit as a communication interface is provided. Logic of the integrated circuit is configured as a dynamic clock trunk tree associated with a transceiver module, where the dynamic clock trunk tree is controlled by a trunk driver having a first clock tree gate. Logic of the integrated circuit is configured as a dynamic clock leaf tree associated with a PCI Express (PCIe) device coupled with the transceiver module. The dynamic clock leaf tree is controlled by a leaf driver having a second clock tree gate, a gate enable block, and a gate disable block.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIGS. 4A and 4B show an illustrative physical coding sublayer (PCS) configuration table and an illustrative physical medium attachment (PMA) configuration table, respectively, according to some embodiments.

DETAILED DESCRIPTION OF THE INVENTION

Figure 1:
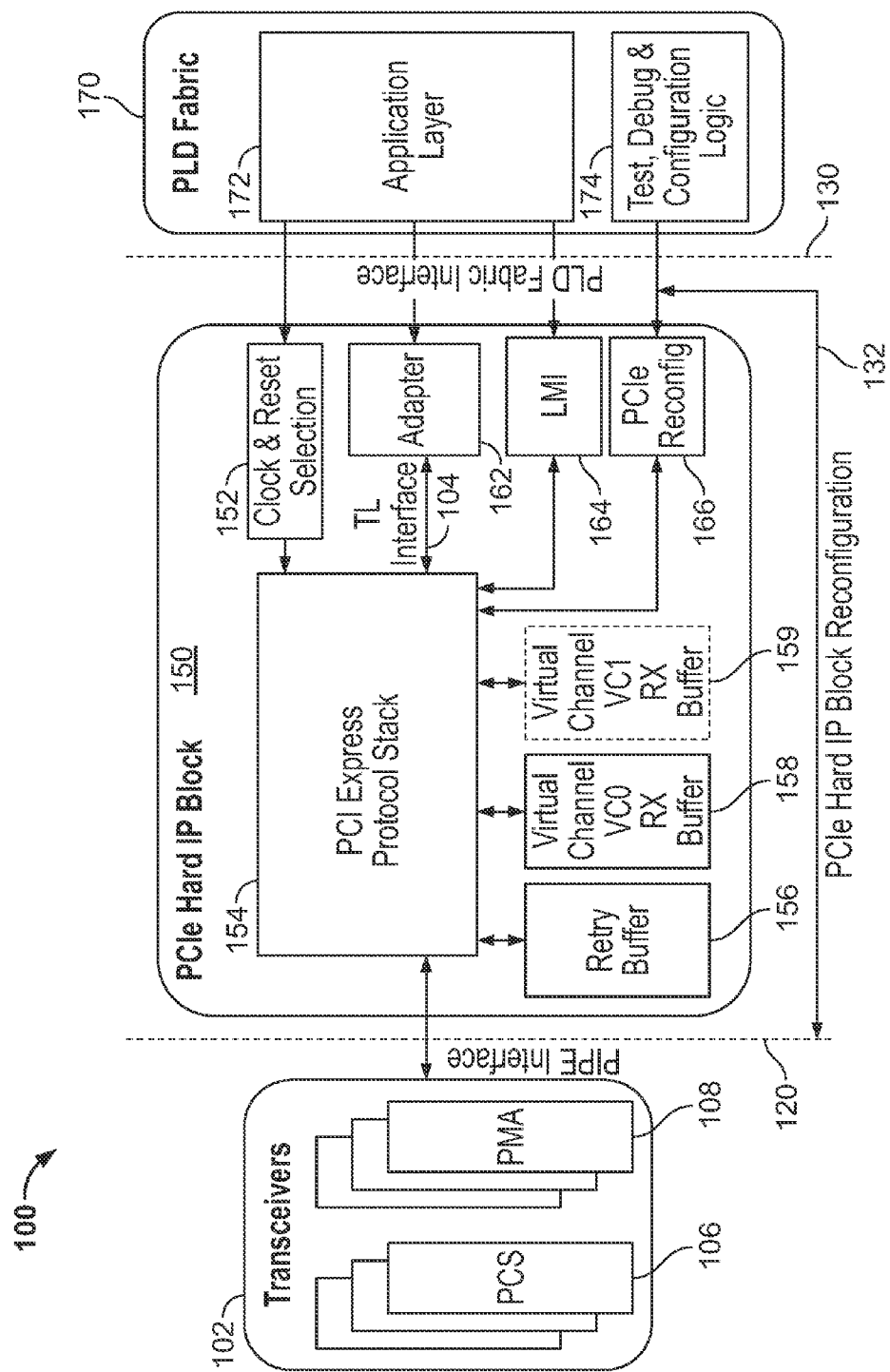
FIG. 1 is a simplified depiction of an illustrative system including a PCI Express (PCIe) Hard IP (HIP) module in accordance with some embodiments.

FIG. 1 is a simplified depiction of an illustrative system 100 including a PCI Express (PCIe) Hard IP (HIP) module in accordance with some embodiments. System 100 includes PCIe Hard IP module 150, transceiver block 102, and PLD Fabric 170. Data is transmitted between the transceiver block 102 and the PLD Fabric 170 via the PCIe HIP module 150.

Transceiver block 102 includes a physical media attachment (PMA) circuit block 106 for a number N of data channels and corresponding physical coding sublayer (PCS) circuit block 108 for the N data channels, each data channel corresponding to a stream of data being received to or transmitted from the transceiver block.

The PCS circuit block 108 generally provides digital logic functions which implement data communication protocols (e.g., PCIe), while the PMA circuit block 106 generally provides mixed (analog/digital) signal functionality for the data communications. For example, PCS circuit block 108 may be configured to perform, among other functions, 8-bit (octet) to 10-bit encoding for data to be sent to PMA circuit block 106 and 10-bit to 8-bit decoding for data received from the PMA circuit block 106. PMA circuit block 106 may be configured to perform, among other operations, serialization of data to be transmitted (conversion from parallel to serial) and de-serialization of received data (conversion from serial to parallel).

Transceiver block 102 may communicate with PLD fabric 170 via PCIe HIP module 150. This communication may be defined using an industry-standard interface, such as the PHY Interface for PCI Express (PIPE) interface 120.

PCIe HIP module 150 includes a PCIe protocol stack 154 for implementing a PCIe protocol. The PCIe protocol stack 154 may implement the various layers of the PCIe protocol, e.g., the physical layer, the data link layer, and the transaction layer. The PCIe protocol stack 154 may be coupled to embedded PCIe memory components, such as Retry Buffer 156 and virtual channel Receive (RX) Buffers 158 and 159. Retry Buffer 156 may hold each Transaction Layer Packet (TLP) transmitted from transceiver 102 until that TLP is acknowledged by its target device, e.g., PLD fabric 170. The Receive Buffers 158 and 159 are configured to temporarily store receives TLPs while TLP checks are performed but before the TLPs are processed and/or consumed. This may be in tandem with the PCIe flow control protocol, to confirm that a transmitting device transmits a TLP over the link to a remote, receiver device only if the receiver device has receive buffer space to accept TLPs.

PCIe HIP module 150 includes a clock and reset selection block 152 for providing and maintaining clock signals and reset structures for circuitry within the PCIe HIP module. Some embodiments may add additional PCIe ports without changing the clock or reset functionality of block 152. Other embodiments may adapt the clock and reset selection block 152 to enable each port to be gated and ungated individually in a clock gating structure. Details of these embodiments will be presented with reference to FIGS. 2 and 3 below.

PCIe HIP module 150 includes Local Management Interface (LMI) 164 to provide access to the PCIe Configuration Space in the Transaction Layer. LMI 164 may be used to write log error descriptor information in the TLP header log registers or other similar operations. In some embodiments, LMI 164 accesses other registers for debugging.

PCIe HIP module 150 includes Reconfig PCIe block 166 for configuring or reconfiguring PCIe protocol stack 154. In some embodiments, this configuration or reconfiguration can be done using configuration data from test debug & config logic block 174 of PLD fabric 170 or from link 132 through the PIPE interface 120. In some embodiments, the PCIe Reconfig block 166 allows users to dynamically change the read-only values stored in Configuration Registers.

By hard-wiring some or all of the components of PCIe HIP module 150, several advantages may be achieved. For example, a PCIe HIP module may offer significant resource savings, embedded memory buffers (e.g., in the form of Retry Buffer 156 and RX Buffers 158 and 159), and pre-verified, protocol-compliant complex IP (e.g., as embedded in PCIe protocol stack 154). Other advantages may include shorter design and compile times with timing closed block (e.g., because clock and reset selection block 152) and substantial power savings relative to a soft IP core with equivalent functionality.

The illustrated HIP module 150 is only exemplary and it should be understood that other components or architectures and any number of HIP modules such as HIP module 150 may be used without departing from the scope of this disclosure. For example, HIP module 150 may include a Transceiver Reconfiguration block (not shown) that allows users to dynamically reconfigure the values of the analog settings in PMA. Multiple duplicates of the PCIe HIP module 150 may be used by system 100, e.g., to allow for multi-port implementations.

Many aspects of FIG. 1 may be changed without departing from the scope of this disclosure. For example, although FIG. 1 shows PLD fabric 170, this is meant for the purposes of illustration not limitation. It should be understood that embodiments can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs). Although FIG. 1 shows only one transceiver block 102, it should be understood that any number of transceiver blocks may communicate with the PCIe HIP module 150. Although two RX buffers are shown, any suitable number of RX buffers may be used, for example, only one RX buffer may be used in case channel virtualization is not implemented.

In one exemplary embodiment, the PLD fabric 170 is an FPGA fabric, the interface 130 is an FPGA fabric interface, and the PCIe HIP embeds the PCI Express protocol stack into the FPGA Fabric. By providing power management functionality in at least in part in PCIe Hard IP Block 150, benefits in performance and flexibility are achieved, as customers are now able to save power in the FPGA fabric, without decreasing performance. This further enhances the benefits from using PCIe Hard IP blocks, such as logic element savings per hard IP instance, embedded memory buffers included in the hard IP, pre-verified, protocol-compliant complex IP, shorter design and compile times with timing closed block, and substantial power savings relative to a soft IP core with equivalent functionality. The power management functionalities disclosed herein thus give customers the ability to use the FPGA fabric based on their applications' needs, while still exploiting the benefits of the PCIe Hard IP.

According to one aspect of this disclosure, hardware-initiated mechanisms are implemented in order to reduce power consumption of a PCIe HIP block similar to PCIe HIP block 150 of FIG. 1. In some embodiments, these hardware-initiated mechanisms may enable dynamic clock gating to achieve power savings in response to behavior of or changes associated with the PCIe HIP block and/or link. Dynamic clock gating as used herein refers to any suitable method and/or apparatus for enabling and/or disabling clock signals. For example, a dynamic clock gating mechanism may operate by disabling clocking of logic components during periods of non-activity, such that the clocking may be enabled or re-enabled based on incoming wake data and/or signals to that logic component.

Dynamic clock gating may be enabled for any suitable portion of a clock tree, in response to any suitable event, including a communication event, a software-driven event, and/or a hardware-driven event. In some implementations, dynamic clock gating is enabled for a clock tree leaf driver of a PCIe HIP block in response to a corresponding PCIe link entering into a low power state. In some implementations, the PCIe HIP block may transition to a powerdown state in response to the PCIe link entering a low power state. For example, the powerdown state may correspond to a low power state of an interface between the PCIe device and another device such as a transceiver. In one example, this powerdown state corresponds to a low power state of an interface module in connection with the outside world via a physical layer. The connection may be based on a PHY Interface for the PCI Express ("PIPE") or any other suitable protocol. A description of the PIPE interface is available in the specification entitled "PHY Interface for the PCI Express, SATA, and USB 3.0 Architectures," version 4.0, by Intel Corporation (hereinafter "the PIPE specification"), which is hereby incorporated by reference in its entirety.

In some implementations, dynamic clock gating may be enabled in response to a connected PCIe device entering a lower power mode, such as L0s. For example, the dynamic clock gating may be enabled in response to a transceiver/transmitter entering a TxL0s state and/or a transceiver/receiver entering an RxL0s mode. L0s is a low power state that allows a PCIe Link to quickly enter and recover from a power conservation state without going through Recovery. Because a transmitter and a receiver in a transmitter-receiver pair may not be required to be in L0s simultaneously, lower power states may be defined for each one of the transmitter and the receiver, e.g., as a transmitter-specific L0s state (TxL0s) and a receiver-specific L0s state (RxL0s).

In some implementations, dynamic clock gating may be enabled in response to the PCIe link being disabled, and/or to the PCIe link entering a low power state such as L1 or L2. In some implementations, dynamic clock gating may be enabled in response to the system software disabling the function of the PCIe port permanently or temporarily.

In some implementations, the PCIe HIP block may signal to or direct the transceiver to transition to a powerdown state in response to the PCIe link entering a low power state, a disabled state, and/or a function-disabled state.

In some embodiments, the PCIe HIP block may transition to a powerdown state in response to a PCIe link entering a L0s state or L1 state. In general, a PCIe device controls its transmitter to enter L0s, whereas the entering into L0s by a receiver associated with the transmitter is controlled by another device, typically on the other side of the communication. In one example, the PCIe HIP block may transition to a powerdown state P0s, e.g., as defined in the PIPE interface, in response to a PCIe link entering the L0s state. In another example, the PCIe HIP block may transition to a powerdown state P2, e.g., as defined in the PIPE interface, in response to a PCIe link entering the L1 or L2 state.

In some embodiments, channels or lanes which are not being used are transitioned to a PIPE powerdown state, such as P2 state. Such transitioning may be based on statistical analysis of behavior of the channels. Aspects of these power-saving mechanisms will be described in greater detail below.

FIGS. 4A and 4B show illustrative PCS configuration table 400 and illustrative PMA configuration table 450, respectively, according to some embodiments. PCS and PMA may be components of a transceiver system that is configured to store the powerdown states. For example, the PCIe HIP may direct these PCS and/or PMA components to powerdown in response to respective PCIe low power states described above. The tables below show illustrative mappings of PIPE powerdown states that may be used in PCS and/or PMA circuitries similar to PCS and PMA circuitries of FIG. 1, in order to achieve power savings. The illustrated tables operate by disabling portions of PCS and/or PMA functionality, respectively, at different PIPE power states.

PCS configuration table 400 assigns illustrative settings for various exemplary PCS functions based on the PIPE power state. For example, the first row 401 of PCS table 400 shows PIPE input signal "Powerdown[1:0]," which puts the transceiver into one of multiple power states (including Reset). These power states (also referred to as P-states) are described in the PIPE specification, and are typically implemented as follows in PIPE-compliant interfaces:

1. P0—normal operation
2. P0s—low recovery time latency, power saving state. PCLK remains on, but Rx conserves power; entered when Rx detects electrical idle. Corresponds to link state L0s.
3. P1—longer recovery time latency, lower power state. PCLK remains on, both Rx and Tx are in electrical idle. Corresponds to link state L1.
4. P2—lowest power state. PCLK is off, PHY minimizes power consumption. Corresponds to link state L2.
5. Reset—When asserted, this input to the PHY puts the transmitter and receiver in the default state.

Some embodiments of the present disclosure take advantage of the PIPE powerdown states in ways that do not follow the above recommendations of the PIPE specification. For example, in some embodiments, the PCIe L1 state is mapped to the PIPE P2 state, instead of to the P1 state as recommended by the PIPE specification. Alternatively or additionally, some PCIe states such as Link Disabled, Unused Channels, or Function Disable may be mapped to the PIPE P2 state. In doing so, some embodiments may take advantage of the PIPE powerdown states, such as the P2 state, to allow PCLK gating in the low-power PCIe states and hence allow high power-consuming components, such as Phase Lock Loop (PLL) components, to be shut down.

Each of rows 403 through 411 illustrates power settings for a PCS state or feature that may be activated, enabled, disabled, reset, powered on, or powered off, in response to the PHY interface transitioning into a particular PIPE powerdown state. For example, row 403 specifies power settings for PCS data transmission feature, which in this example occurs only during normal operation, i.e., at power state P0. Row 404 specifies the settings for "Tx Phase Compensation FIFO Pointers", while row 407 specifies the settings for "Rx Phase Compensation FIFO Pointers". These pointers point to transmission phase compensation FIFOs or to receiver phase compensation FIFOs, which may be located at the boundary between a PCIe core and PCS/transceivers. The phase compensation buffers may be used to compensate the possible different phases in the write clock and read clock between the PCIe core and PCS/transceivers. Rows 405 and 408 specify the state of encoder and decoder circuitry, respectively. Row 406 specifies the settings for "PCLK output", which is configured to be ON at P0, P0s and P1, and OFF at P2 and Reset. Row 407 specifies the settings for the "Rate-Match Buffer" feature of PIPE, which is configured to be set to Active at P0 and P0s, and Reset for other states. Row 408 specifies the settings for the PIPE "Word Aligner" feature, which is also configured to be set to Active at P0 and P0s, and Reset for other P-states. Finally, row 409 specifies the settings for "RX Parallel Clock," which is configured to be set to Active for P0 and P0s, ON for P1, and OFF for P2 and Reset.

PMA configuration table 400 assigns illustrative settings for various exemplary PMA functions based on the PIPE power state. Illustrative rows 452, 454, and 456 specify settings for a PMA receiver state or function. Illustrative rows 462, 464, 466 and 468 specify settings for a PMA transmission state or function.

Row 452 specifies power state settings for PMA transmission feature "Tx Bias," which refers to whether the differential transmitter bias voltage is applied or not. This feature is on for in power states P0, P0s, and P1, and off for P2 and Reset to save power.

Row 454 specifies power state settings for PMA transmission feature "Tx Pad," which refers to data transmission. For example, in power state P0, e.g., during normal operation, Tx Pad is active, meaning that transmission of data is enabled. In power state P2, Tx Pad is "High-Z" or high impedance. This may describe that in response to the differential transmitter powering down, the transmitter enters a high-impedance state and floats the differential lines. In power state P0s and P1, Tx Pad is in "common mode". For example, this may describe that the transmitter common mode voltage remains at the same voltage once driven after power-on of the link, and can be turned off only when the transmitter is placed in powerdown state P2.

Row 456 corresponds to PMA transmission feature "serializer", which refers to the feature of converting parallel data (usually in different widths) to serial data, and presenting that data to the transmission driver to be transmitted on the line. As illustrated in row 456, this feature is turned on during normal operation, and otherwise turned off to conserve power.

Row 462 specifies whether the clock and data recovery (CDR) feature is on or off based on the PIPE power state.

Row 464 specifies power state settings corresponding to PMA receiver feature "Rx Equalizers." Equalization refers to a method of distorting a data signal with a transform representing an approximate inverse of the channel response, for example, Decision Feedback Equalizer (DFE).

Row 466 specifies power state settings corresponding to PMA receiver feature "deserializer", which refers to the converse of the transmission serializer feature of row 456.

Row 468 corresponds to PMA receiver feature "Signal detect." For example, differential signaling detector usually detects the amplitude level of incoming signals and determines if the amplitude is above a threshold to indicate a valid input signal from the other device at the other side of communication. Periodically turning on and off in P2 state may allow extra power savings.

It should be understood that the specific mappings in the configuration tables of FIGS. 4A and 4B are merely for the purpose of illustration, not limitation, and that any suitable mapping between PIPE power states and PCS and/or PMA functions, states and/or features may be used without departing from the scope of the disclosure. Also, any suitable communication layer (other than PCS and PMA) may be used without departing from the scope of this disclosure.

The configuration illustrated in FIGS. 4A and 4B may need to take into account exit latency requirements of the PCIe device, for example, the latency time needed by the PCIe device when exiting L0s or L1. As just one example of these latency considerations, consider an application having an Ethernet controller that uses a PCIe interface as a high-speed peripheral interface. It may be highly advantageous for that Ethernet controller with a PCIe interface to support the PCIe L1 state so that the PCIe link may autonomously transition to a low power state during idle intervals on Le PCIe interface. However, such L1 latencies may adverse impact the latency that it takes for one network station to process and respond to a network packet that was sent by another network station. To address this issue—particularly in scenarios where latency times are detrimental, such as with latency-sensitive applications or benchmarks—some embodiments of the present disclosure design for L1 latency times that may be introduced by the mappings between PIPE power states and PCS and/or PMA functions discussed above.

Figure 2:
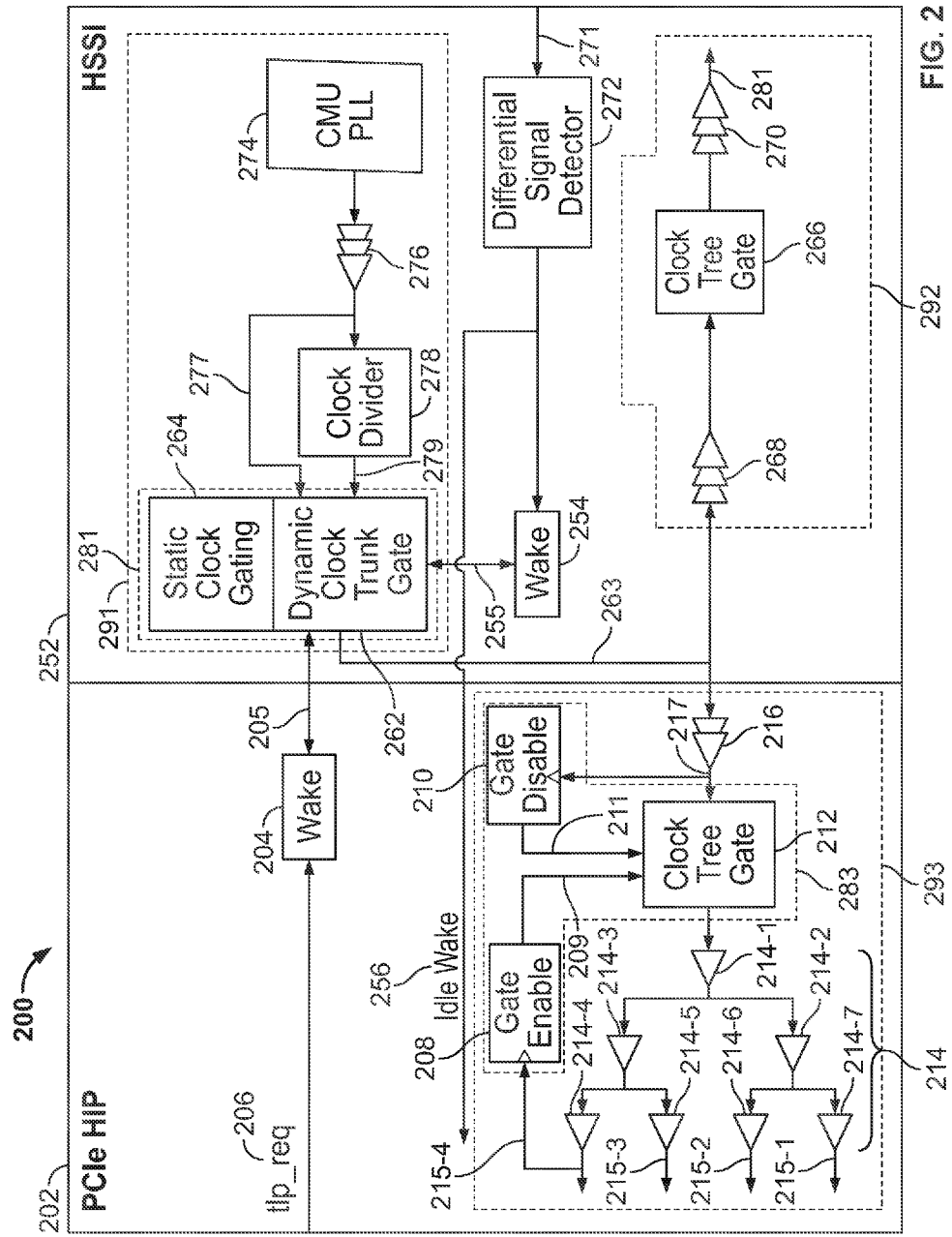
FIG. 2 is a simplified depiction of an illustrative system with a clock gating architecture according to some embodiments.

FIG. 2 is a simplified depiction of an illustrative system 200 with a clock gating architecture according to some embodiments. System 200 includes illustrative PCIe HIP module 202 and illustrative high-speed serial interface (HSSI) module 252. Illustrative PCIe HIP module 202 includes wake block 204, gate enable block 208, gate disable block 210, clock tree gate circuitry 212, and clock tree buffers 214-1 through 214-7 (collectively labeled 214). Illustrative HSSI module 252 includes clock multiplier unit (CMU) phase lock loop (PLL) block 274, clock divider circuitry 278, dynamic clock trunk gate circuitry 262, static clock gating block 264, wake block 254, clock tree gate block 266, and buffer circuitries 268, 270, and 276.

In response to PCIe link transitioning to a lower power state, e.g., from L0 to L1, PCIe HIP module 202 may request to HSSI module 252 to transition to a PIPE powerdown state, e.g., to P2. This may in turn activate dynamic lock gating for a portion of the clock tree circuitry, e.g., for leaf driver circuitry such driver 283 of FIG. 2. Transitioning to P2 may also enable other power savings mechanisms, such as enabling PCLK gating, enabling trunk clock gating, and/or enabling PLL shutdown.

By splitting clock signals into multiple clock trees or subtree structures, system 200 may increase the effectiveness of clock gating and as a result, of power usage. FIG. 2 illustrates clock tree structures 291 and 292 in HSSI module 252, and clock tree structures 293 in PCIe HIP module 202.

Clock tree structure 291 is a trunk clock tree structure, and includes the CMU PLL block 274, buffer circuitry 276, clock divider 278, static clock gating block 264, and dynamic clock trunk gate circuitry 262. CMU PLL block 274 provides clock signal 277 through buffer circuitry 276 and/or clock signal 279 through buffer circuitry 276 and clock divider 278. These clock signals 277 and 279, which may be referred to as PLL Parallel Clock signals, are gated by a trunk driver circuitry 281, which includes dynamic clock trunk gate circuitry 262. Static clock gating block 264 may be configured to statically gate the HSSI channel if the channel is not used.

In the illustrated architecture of FIG. 2, dynamic clock trunk gate circuitry 262 is controlled by a wake signal 205 from wake block 204 and by a wake signal 255 from wake block 254. Wake block 204 may generate wake signal 205 based on a received control signal 206 called tlp_req.

Wake block 254 may generate wake signal 255 based on received control signal 256 called idle_wake. This control signal 256 is received from differential signal detector 272 based on input signal 271. In some implementations, input signal 271 is a differential signal received from an input/output line, e.g., a receiver pad line.

In some embodiments, the tlp_req signal may include a power management configuration request. In a first example, the PCIe device, e.g., module 202, plays the role of an upstream component, and the tlp_req signal includes a power management configuration request initiated by the PCIe device and going downstream. Such a request may be similar to the "PM Configuration Request" described in FIG. 5-3 of the PCI EXPRESS BASE SPECIFICATION, REV. 3.0, pg. 428. In a second example, the PCIe device plays the role of a downstream component, and the idle_wake signal includes a differential signal detected as a result of an incoming request to retrain the PCIe link to the L0 state, e.g., because of a power management configuration request received from the opposite device.

In the illustrated architecture of FIG. 2, the clock trunk tree 291 is activated in response to receiving a wake signal 205 based on tlp_req control signal 206 and/or receiving a wake signal 255 based on idle_wake control signal 256. To do this, in response to receiving a wake signal 205 or 206, dynamic clock trunk tree provides clock signal 263 to downstream portions of the clock tree, e.g., to clock leaf tree/subtree structure 292 and/or 293. Clock signal 263 may be referred to herein as PCLK.

Clock tree structure 292 is a leaf tree structure and includes buffer circuitries 268, clock tree gate circuitry 266, and buffer circuitry 270. Output clock signal 281 may be the PCLK version used in HSSI logic components such as PCS and/or PMA. Clock tree structure 291 may represent the highest hierarchy of clock gate components (called clock trunk), which may gate both clock tree structures 292 and 293 if activated. Clock tree circuitry 266 and clock tree gate 212 may represent the next level of clock gating in the hierarchy (called clock tree leaf).

Clock tree structure 293 is a leaf tree structure and includes buffer circuitry 216, leaf driver 283 and clock tree buffers 214. Clock signal 263 is buffered by buffer circuitry 216 to generate clock signal 217. Clock signal 217 is gated by clock tree gate 212, which is controlled by two control blocks, gate enable block 208 which outputs clock gating enable control signal 209, and gate disable block 210 which outputs clock ungating control signal 211. When ungated, clock signal 217 flows through the tree of buffers 214 to generate output clock signals 215-1, 215-2, 215-3 and 215-4. The tree of buffers 214 is only illustrative, and any suitable number and distribution of buffers may be used to drive clock signal strength throughout the PCIe HIP module 202 may be used without departing from the scope of this disclosure.

Gate enable block 208 may generate clock gating enable control signal 209 based on defined clock gating enable conditions and/or one or more gated clock signals. In the example of FIG. 2, gated clock signal 215-4 is provided to the clock input of gate enable block 208. Analogously, gate disable block 210 may generate clock ungating control signal 211 based on defined clock ungating conditions and/or one or more ungated clock signals. In the example of FIG. 2, live PCIe HIP clock signal 217 is provided to the clock input of gate disable block 210.

Figure 3:
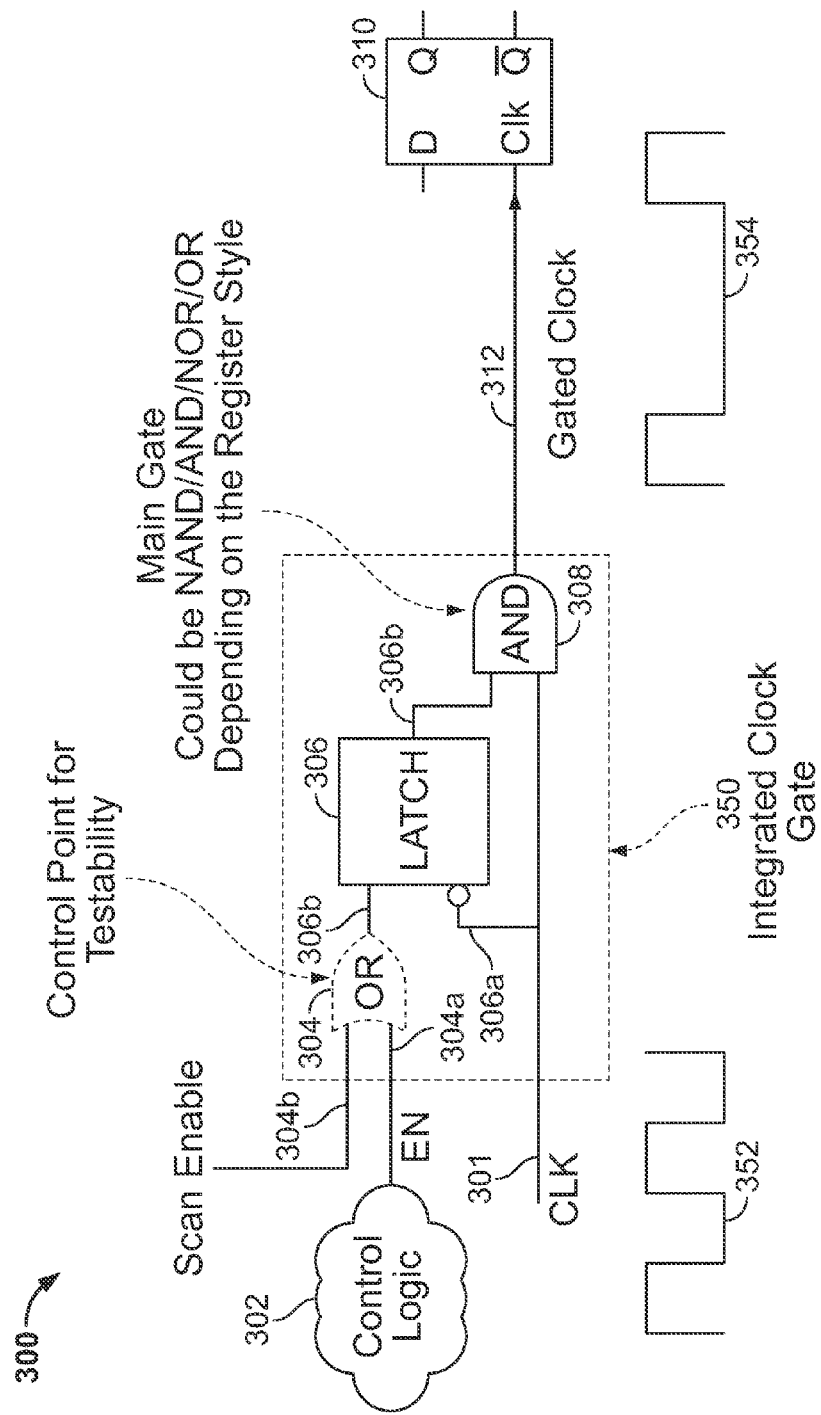
FIG. 3 illustrates clock gating circuitry which may be used in some embodiments.

FIG. 3 shows one possible clock gating circuitry 300 which may be used in some embodiments. Clock gating circuitry 300 is one possible implementation of at least a portion of leaf tree structure 293, and it is understood any known method for clock gating and ungating may be used, e.g., to ensure no glitches on the clock signal, without departing from the scope of this disclosure.

Clock gating circuitry 300 includes integrated clock gate 350 and latch 310. An input clock signal 301 is input into integrated clock gate 350 and represented by timing diagram 352.

The clock signal 301 is gated through main gate 308 to generate gated clock signal 312, represented by timing diagram 354. Gated clock signal 312 may be further registered by D-register 310.

The clock signal 301 may be output by the main gate in response to the latch output signal 306b being activated. Main gate 308 may include any suitable logic circuitry, including but not limited to NAND, AND, NOR, and/or OR gates. Main gate 308 may provide clock signal 301 as a function of input signal 306b.

Input signal 306b may be activated in response to signal "Scan Enable" 204b being enabled using XOR gate 204. Signal "Scan Enable" may provide an easily accessible control point for testability and debugging purposes.

Input signal 306b may also be activated by an output control signal 304a of control logic 302. Such control logic 302 may implement defined clock gating enable conditions and/or clock ungating conditions in order to implement power savings mechanisms.

In one embodiment, control logic 302 may output a clock gating enable control signal 304a in response to the PCIe link state entering a low power state, a disabled state, or a function-disabled state. The low power state may be defined, for example, to include states L1, L2, and/or receiver and transmitter L0s state.

Control logic 302 may output a clock gating enable control signal 304a in response to determining that there are no transactions pending in the PCIe link, that there are no pending internal events, that all queues and buffers are empty, and/or any suitable condition for enabling clock gating.

In one embodiment, control logic 302 may output a clock ungating control signal 304a in response to detecting an incoming cycle from an upstream interface, detecting re-enabling of the PCIe link, and/or detecting differential signaling from an external device, e.g., for example, that the external device has requested to exit either L0s or L1. Control logic 302 may also or alternatively output a clock ungating control signal 304a as part of a flow control update, for example, when in TxL0s.

Figure 5:
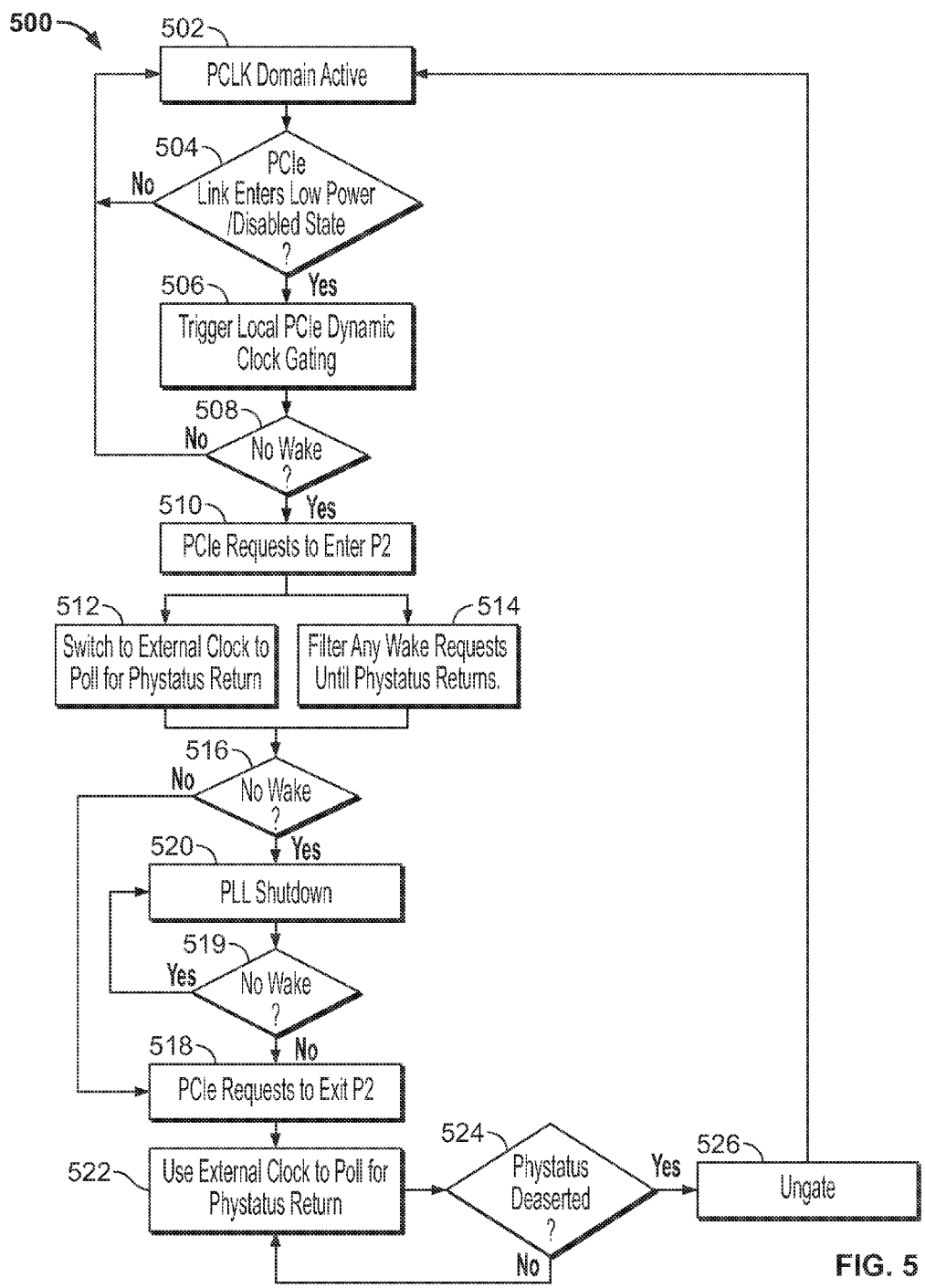
FIG. 5 depicts an illustrative process by which dynamic clock gating on the clock tree level and on the trunk level may be activated according to some embodiments.

FIG. 5 depicts an illustrative process 500 by which dynamic clock gating on the clock tree level and on the trunk level may be activated according to some embodiments. Process 500 may be implemented in circuitry similar to circuitries 291, 292, or 293 of FIG. 2, e.g., to control PCLK gating and/or PLL shutdown in HSSI block 252.

At 502, clock signals are output from the PHY interface. For example, clock PCLK may be used to synchronize data transfers across the parallel PHY interface.

If at 504, PCIe link enters into a low power state such as L1, a disabled state, and/or a function-disabled state, then at 506, local PCIe dynamic clock gating is enabled. This may correspond to activating clock tree gate 212 of FIG. 2.

If no wake request is received at 508 (for example, based on control signal tlp_req 206 or control signal idle_wake 256 of FIG. 2), then at 510, PCIe HIP requests to enter a PIPE powerdown state such as P2. If a wake request is received at 508, then PCLK may be activated again.

At 510, PCIe HIP requests to enter a PIPE powerdown state such as P2. In doing so, PCIe HIP may ensure that logical toggling activities that require PCLK have completed before generating the request to the transceiver.

At 512, PCIe HIP switches to an external clock because PCLK is expected to be turned off in P2 state. This external clock may be used to poll for the status of the PHY interface. In some implementations, this involves designing the PHY interface in such a way that the period in which phystatus stays asserted is at least double that of the external clock period. This may ensure that phystatus can be sampled asynchronously by PCIe HIP in the external clock domain. Such polling of phystatus may, for example, check for the return of output signal phystatus from the PHY interface, which is defined in the PIPE specification to indicate completion of PHY functions such as power management state transitions, rate change, and receiver detection. In addition, at 514, and in response to PCIe HIP requesting to enter P2, PCIe HIP may filter all wake requests until such return of signal phystatus is detected. Similarly, if phystatus generation from PCS is already in progress in response to PCIe HIP requests to enter a PIPE powerdown state such as P2, e.g., from a component similar to wake block 254 of FIG. 2, then PCS may be configured to ignore any wake events and instead continue entering to powerdown state P2 and subsequently return signal phystatus.

At 516 after successfully transitioning into P2 state, if a wake request is detected, then at 518, PCIe requests to exit the PIPE powerdown state P2 and normal clocking operation might follow (e.g., the process may return to 502). The wake request may be detected using wake blocks such as 204 or 254 of FIG. 2.

Alternatively, if no wake request is detected at 516, then at 520, PLL circuitry may be shutdown. Such PLL circuitry may be similar to CMU PLL block 274 of FIG. 2. PLL circuitry may remain turned off at 520 until a wake request is detected at 519. If a wake request is detected at 519, then PCIe requests to exit the PIPE powerdown state P2 at 518.

At 522, PCIe may continue to use the external clock from 512 to poll for phystatus. If phystatus is de-asserted at 524, then it is determined that PCLK is available and valid again. Dynamic clock gating may be disabled in that case, so that the same wake requests are able to trigger ungating at 526 of the dynamic clock gating.

In some implementations, the PLL may not be re-enabled until the PCIe HIP module has requested exiting the PIPE powerdown state such as P2 (e.g., as in step 518) and until the wake request has propagated from the HSSI interface module to the PCIe HIP module. In other implementations, rather than waiting for the wake request to propagate from the HSSI interface module to the PCIe HIP module, the PLL is directly controlled inside the HSSI module, e.g., by a signal detector similar to signal detector 272 of FIG. 2.

In some embodiments, some channels may be configured to transition to low power mode in order to achieve power savings. For example, a user may not necessarily configure a PCIe HIP module to use the maximum number of channels. In this case, the non-utilized channels may be statically transitioned to a powerdown state, such as P2. For example, the non-utilized channels may be transitioned permanently to the powerdown until the next fundamental reset. Such a configuration may increase power savings in two ways. First, such a configuration may decrease the power consumption in the non-utilized channels. Second, such a configuration may increase power savings in the system overall because it would trigger the activation of clock gating mechanisms, such as PCLK gating and/or PLL shutdown, in response to the other, utilized, channels transitioning to P2 when the link is idle (e.g., when the PCIe link is in L1 state).

The mechanisms described above may significantly decrease power consumption. In one illustrative and non limiting implementation, about 94% of the PCIe HIP area is gated at the trunk clock level and about 89% of the PCIe HIP area is gated at the leaf clock driver level. With a toggle rate of 12.5% and efficiency of about 40% (factoring in frequency of link activity and clock gating efficiency), the power savings target is estimated to be about 30%. These numbers are purely exemplary, and it is contemplated that other, different percentages of circuitry may be gated at other toggle rates and efficiency rates without departing from the scope of this disclosure.

It will be understood that the foregoing is only illustrative of the principles of the invention, and that various modifications may be made by those skilled in the art without departing from the scope and spirit of the invention, and the present invention is limited only by the claims that follow. For example, although the embodiments above describe a PCIe HIP module, this is meant for illustration not limitation, and the same concepts apply to other types of communication protocols (e.g., serial, parallel, packetized, etc.) and/or other types processing systems that may comprise hardware (e.g., circuitry, dedicated logic, programmable logic, etc.), software (such as instructions run on a processing device), or a combination thereof.

What is claimed is:

1. An integrated circuit comprising:
a dynamic clock trunk tree associated with a transceiver module, wherein the dynamic clock trunk tree is controlled by a trunk driver, said trunk driver comprising a first clock tree gate, and wherein the first clock tree gate receives a first clock signal and outputs a second signal, wherein the second clock signal represents a gated or ungated form of the first clock signal; and
a dynamic clock leaf tree associated with a PCI Express (PCIe) device coupled with the transceiver module, wherein the dynamic clock leaf tree is controlled by a leaf driver, said leaf driver comprising a second clock tree gate, wherein the second clock tree gate receives the second clock signal and outputs a third clock signal, wherein the third clock signal represents a gated or ungated form of the second clock signal, and wherein the leaf driver controls the dynamic clock leaf tree based at least in part on the second clock signal.

2. The integrated circuit of claim 1, wherein the trunk driver is coupled to a first wake block, the first wake block associated with a request from a PCIe transaction layer in the PCIe device.

3. The integrated circuit of claim 2, wherein the trunk driver is coupled to a second wake block, the second wake block associated with detection of an input signal in the transceiver module.

4. The integrated circuit of claim 1, wherein the PCIe device directs at least one of a Physical Coding Sublayer (PCS) component and a Physical Medium Attachment (PMA) component to power down in response to a low power state.

5. The integrated circuit of claim 4, wherein the PCIe device directs the at least one of the PCS component and the PMA component according to a pre-configured power setting of a feature of the at least one of the PCS component and PMA component.

6. The integrated circuit of claim 1, wherein the PCIe device requests to enter a powerdown state in response to the trunk tree driver not receiving wake requests.

7. The integrated circuit of claim 1, wherein the PCIe device comprises a PCIe Hard IP block.

8. A communication interface comprising:
circuitry configurable as a dynamic clock trunk tree associated with a transceiver module, wherein the dynamic clock trunk tree is controlled by a trunk driver, said trunk driver comprising a first clock tree gate, and wherein the first clock tree gate receives a first clock signal and outputs a second clock signal, wherein the second clock signal represents a gated or ungated form of the first clock signal; and
circuitry configurable as a dynamic clock leaf tree associated with a PCI Express (PCIe) device coupled with the transceiver module, wherein the dynamic clock leaf tree is controlled by a leaf driver, said leaf driver comprising a second clock tree gate, wherein the second clock tree gate receives the second clock signal and outputs a third clock signal, wherein the third clock represents a gated or ungated form of the second clock signal, and wherein the leaf driver controls the dynamic clock leaf tree based at least in part on the second clock signal.

9. The communication interface of claim 8, wherein the trunk driver is coupled to a first wake block, the first wake block associated with a request from a PCIe transaction layer in the PCIe device.

10. The communication interface of claim 9, wherein the trunk driver is coupled to a second wake block, the second wake block associated with detection of an input signal in the transceiver module.

11. The communication interface of claim 8, wherein the PCIe device directs at least one of a Physical Coding Sublayer (PCS) component and a Physical Medium Attachment (PMA) component to power down in response to a low power state.

12. The communication interface of claim 11, wherein the PCIe device directs the at least one of the PCS component and the PMA component according to a pre-configured power setting of a feature of the at least one of the PCS component and PMA component.

13. The communication interface of claim 8, wherein the PCIe device requests to enter a powerdown state in response to the trunk tree driver not receiving wake requests.

14. The communication interface of claim 8, wherein the PCIe device comprises a PCIe Hard IP block.

15. A method for configuring an integrated circuit as a communication interface, the method comprising:
    configuring logic of the integrated circuit as a dynamic clock trunk tree associated with a transceiver module, wherein the dynamic clock trunk tree is controlled by a trunk driver, said trunk driver comprising a first clock tree gate, wherein the first clock tree gate receives a first clock signal and outputs a second clock signal, wherein the second clock signal represents a gated or ungated form of the first clock signal; and
    configuring logic of the integrated circuit as a dynamic clock leaf tree associated with a PCI Express (PCIe) device coupled with the transceiver module, wherein the dynamic clock leaf tree is controlled by a leaf driver, said leaf driver comprising a second clock tree gate, wherein the second clock tree gate receives the second clock signal and outputs a third clock signal, wherein the third clock signal represents a gated or ungated form of the second clock signal, and wherein the leaf driver controls the dynamic clock leaf tree based at least in art on the second clock signal.

16. The method of claim 15, wherein the trunk driver is coupled to a first wake block, the first wake block associated with a request from a PCIe transaction layer in the PCIe device.

17. The method of claim 16, wherein the trunk driver is coupled to a second wake block, the second wake block associated with detection of an input signal in the transceiver module.

18. The method of claim 15, wherein the PCIe device directs at least one of a Physical Coding Sublayer (PCS) component and a Physical Medium Attachment (PMA) component to power down in response to a low power state.

19. The method of claim 18, wherein the PCIe device directs the at least one of the PCS component and the PMA component according to a pre-configured power setting of a feature of the at least one of the PCS component and PMA component.

20. The method of claim 15, wherein the PCIe device requests to enter a powerdown state in response to the trunk tree driver not receiving wake requests.

* * * * *